(12) United States Patent
Watanabe (10) Patent No.: US 7,106,628 B2
(45) Date of Patent: Sep. 12, 2006

(54) SEMICONDUCTOR DEVICE HAVING ENHANCED BREAKDOWN VOLTAGE

(75) Inventor: Taketo Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 6 days.

(21) Appl. No.: 11/061,475

(22) Filed: Feb. 22, 2005

(65) Prior Publication Data

US 2006/0092700 A1 May 4, 2006

(30) Foreign Application Priority Data

Oct. 29, 2004 (JP) ............................. 2004-316790

(51) Int. Cl.
*G11C 11/34* (2006.01)
*G11C 16/04* (2006.01)

(52) U.S. Cl. ........................... 365/185.05; 365/185.18; 365/185.27; 257/409; 257/487

(58) Field of Classification Search ........... 365/185.05, 365/185.18, 185.27, 185.33; 257/355, 409, 257/469, 487
See application file for complete search history.

(56) References Cited

U.S. PATENT DOCUMENTS 5,862,082 A * 1/1999 Dejenfelt et al. ...... 365/185.33
5,959,344 A * 9/1999 Mamontov et al. ......... 257/566
6,924,782 B1* 8/2005 Fujioka et al. ................ 345/92
2002/0117714 A1* 8/2002 Hebert ....................... 257/339

FOREIGN PATENT DOCUMENTS

| JP | 11-133925 | 5/1999 |
| JP | 11-133926 | 5/1999 |
| JP | 2000-323584 | 11/2000 |

* cited by examiner

*Primary Examiner*—Son T. Dinh
*Assistant Examiner*—Toan Le
(74) *Attorney, Agent, or Firm*—Westerman, Hattori, Daniels & Adrian, LLP.

(57) ABSTRACT

A semiconductor device has: a main circuit including a plurality of MOS transistors operating at a first voltage; a memory requiring an operation at a second voltage higher than the first voltage; and a drive circuit for driving the memory, the drive circuit comprising one well, two or more MOS transistors in a cascade connection formed in the well, and well contact or contacts formed between MOS transistors in the well and on both outer sides of the cascade connection, or formed only between MOS transistors, or formed on both outer sides of the cascade connection, or formed only outside a drain of MOS transistors in the cascade connection. The semiconductor device is provided which integrates a memory requiring a high voltage, can simplify manufacture processes for a memory drive circuit and suppress an increase in an occupation area in chip of the memory drive circuit.

10 Claims, 13 Drawing Sheets

SEMICONDUCTOR DEVICE HAVING ENHANCED BREAKDOWN VOLTAGE

CROSS REFERENCE TO RELATED APPLICATION

This application is based on and claims priority of Japanese Patent Application No. 2004-316790 filed on Oct. 29, 2004, the entire contents of which are incorporated herein by reference.

BACKGROUND OF THE INVENTION

A) Field of the Invention

The present invention relates to a semiconductor device, and more particularly to a semiconductor device having a main circuit operating at a first voltage and a memory requiring an operation at a second voltage higher than the first voltage.

B) Description of the Related Art

An operation voltage of a semiconductor integrated circuit is lowering from 3 V to 2.5 V and to 1.25 V. A flash memory requires a high voltage of about 10 V. Because of its non-volatility performances, a flash memory is used in various logical integrated circuits. For example, the application range is broadening to logical integrated circuits mixedly mounting flash memories, such as a field programmable gate array (FPGA) and a complex programmable logic device (CPLD). MOS transistors for controlling a memory requiring a high voltage such as a flash memory cell require a very high voltage. In order to realize a very high breakdown voltage of a MOS transistor, some design is necessary for determining an impurity concentration distribution of drain regions and wells, resulting in a considerable increase in the number of processes. In order not to increase the number of processes, it is desired to use general MOS transistors and operate the MOS transistors at a voltage higher than the drain breakdown voltage.

Techniques have been proposed which operate a MOS transistor at a voltage higher than the drain breakdown voltage. For example, two or more MOS transistors each formed in an independent well are connected in a cascade. As each MOS transistor is formed separately in an independent well, the device area becomes very large. If a plurality of MOS transistors are formed in one well and connected in a cascade, the breakdown voltage tends to be lowered. For these techniques, for example, refer to Japanese Patent Laid-open Publications No. 2000-323584 and HEI-11-133926.

SUMMARY OF THE INVENTION

An object of the present invention is to provide a multi-voltage semiconductor device having a high breakdown voltage portion and being capable of suppressing an increase in an occupation area in chip.

Another object of the present invention is to provide a semiconductor device mixedly mounting memories which require a high voltage, being capable of simplifying manufacture steps for a memory drive circuit and suppressing an increase in an occupation area of the memory drive circuit.

According to one aspect of the present invention, there is provided a semiconductor device comprising: a main circuit including a plurality of MOS transistors operating at a first voltage; a memory requiring an operation at a second voltage higher than the first voltage; and a drive circuit for driving the memory, the drive circuit comprising one well, two or more MOS transistors in a cascade connection formed in the well, and a well contact formed between MOS transistors in the well and on both outer sides of the cascade connection, or formed only between MOS transistors, or formed on both outer sides of the cascade connection, or formed only outside a drain of MOS transistors in the cascade connection.

As a plurality of transistors are formed in one well and connected in cascade, the breakdown voltage of transistors change with the layout of well contacts. By properly selecting the layout of well contacts, a transistor breakdown voltage can be improved.

DESCRIPTION OF THE PREFERRED EMBODIMENTS

Figure 1A:
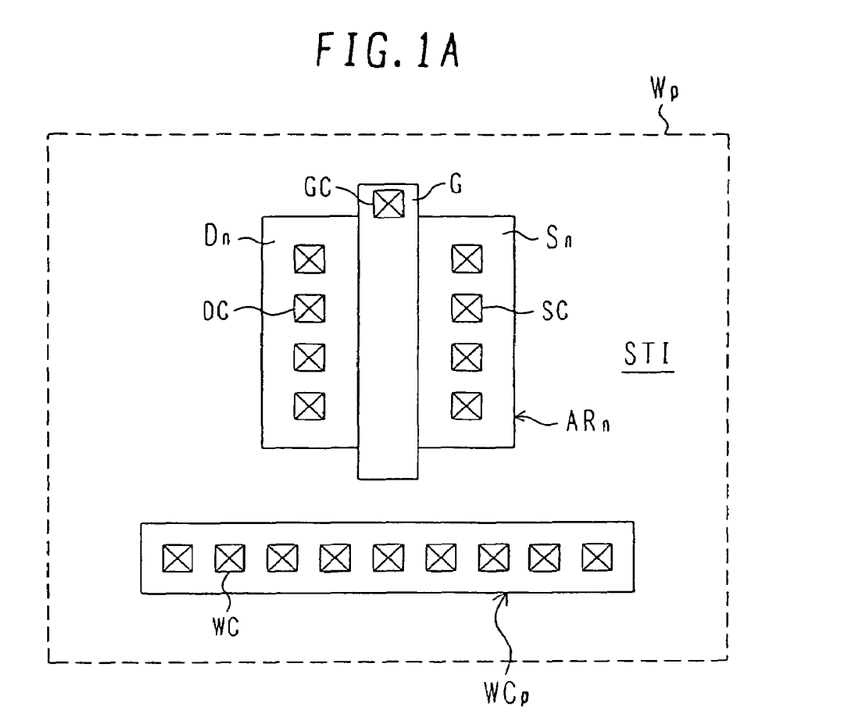
FIGS. 1A and 1B are a plan view showing an example of the structure of a single transistor and a graph showing the characteristics of the transistor.
Figure 1B:
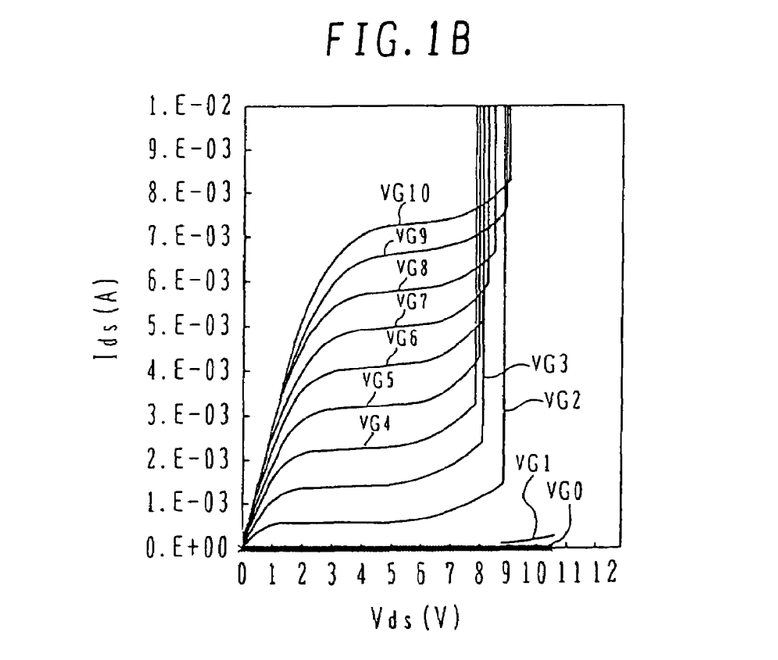

FIGS. 1A and 1B are a plan view showing the structure of a general single transistor and a graph showing its characteristics.

As shown in FIG. 1A, a p-type well Wp is formed in a silicon substrate and an element isolation region made of shallow trench isolation (STI) defines an active region ARn in which an n-channel MOS transistor is formed and a p-type region WCp in which well contacts are formed. A gate electrode G is formed traversing the active region, and a gate contact GC provides a contact with the gate electrode G. In the regions on both sides of the gate electrode G, n-type impurity ions are doped to form an n-type source region Sn and an n-type drain region Dn. Source contacts SC and drain contacts DC are formed in the source and drain regions, respectively. Well contacts WC are formed in the well contact region WCp. FIG. 1B shows the characteristics of this transistor, with the gate length being set to 1 μm and a distance between the active region ARn and well contact region WCp being set to 2 μm.

In FIG. 1B, the abscissa represents a source-drain voltage Vds in the unit of V, and the ordinate represents a drain current Ids in the unit of A. A curve VG0 indicates a drain current at a gate voltage of 0 V, and curves VG1 to VG10 indicate drain currents at the gate voltages of 1 V to 10 V, respectively.

Breakdown voltages of a MOS transistor have two breakdown voltages: a breakdown voltage (non-operation breakdown voltage) in a transistor off-state and a breakdown voltage (operation breakdown voltage) in a transistor on-state. The drain breakdown voltage at the gate voltage of 0 V is the non-operation breakdown voltage, and is over 10 V in the graph shown in FIG. 1B. The characteristics at the gate voltage of 1V or higher, particularly the characteristics at VG2 or higher with abrupt rise of the drain current, are the characteristics in operation, and the voltage at which the drain current abruptly rises is the operation breakdown voltage. In the characteristics shown in FIG. 1B, at the gate voltage of 3 V or higher, the drain current increases greatly at the drain voltage of about 8 V and the operation breakdown voltage is lower than 9 V. The operation breakdown voltage in the on-state becomes in some cases lower than the non-operation breakdown voltage in the off-state.

For the operation breakdown voltage, a snap-back phenomenon showing a negative resistance is observed in some cases. The snap-back phenomenon appears when a parasitic bipolar transistor of source-well-drain turns on because avalanche breakdown occurs due to a high electric field near the drain and the well potential rises.

Figure 2A:
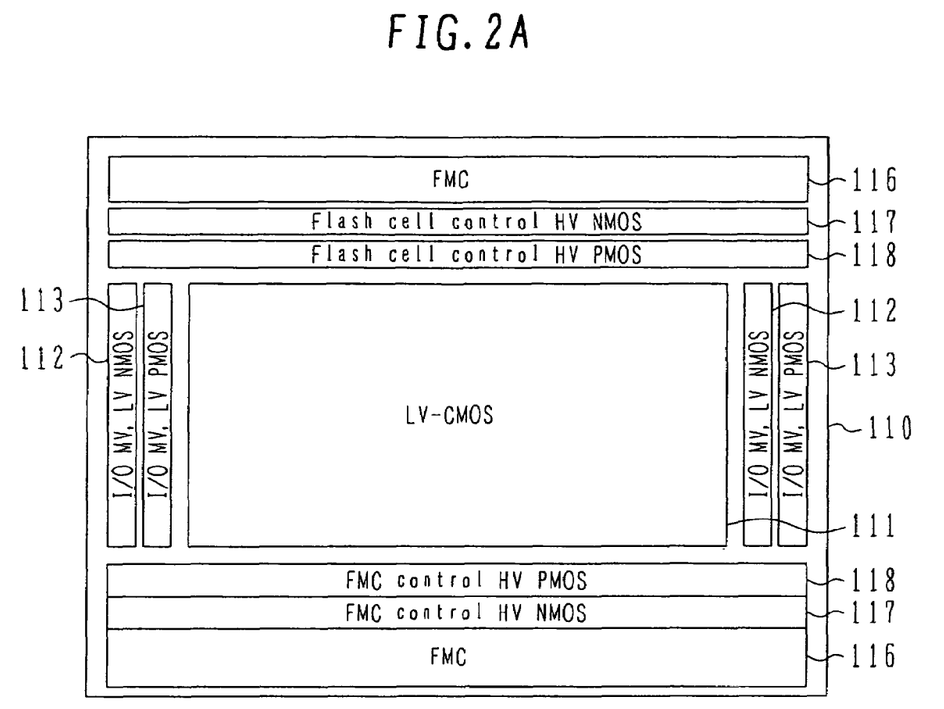
FIGS. 2A, 2B and 2C are a plan view, a cross sectional view and an equivalent circuit showing a semiconductor integrated circuit integrating flash memories.

FIG. 2A shows an example of the structure of a semiconductor logical integrated circuit mixedly mounting flash memories. A logic CMOS circuit 111 operating at a low voltage (LV: e.g., 1.25 V) is disposed in the central area of a semiconductor chip 110, and disposed on both sides of the logic CMOS circuit are an input/output n-channel MOS transistor (NMOS) circuit 112 and an input/output p-channel MOS transistor (PMOS) circuit 113 operating at a low voltage (LV: e.g., 1.25 V) and a middle voltage (MV: e.g., 3 V), respectively. A flash memory circuit 116 is disposed in upper and lower areas of the semiconductor chip 110. An NMOS circuit 117 and a PMOS circuit 118 for controlling flash memory cells are disposed on the inner side of the flash memory circuit. The NMOS circuit 117 and PMOS circuit 118 are constituted of high voltage (HV: e.g., 5 V) transistors.

A flash memory cell FMC is required to operate at a high voltage of about 10 V. The flash memory cell control circuits 117 and 118 are also required to operate at similar high voltage.

Figure 2B:
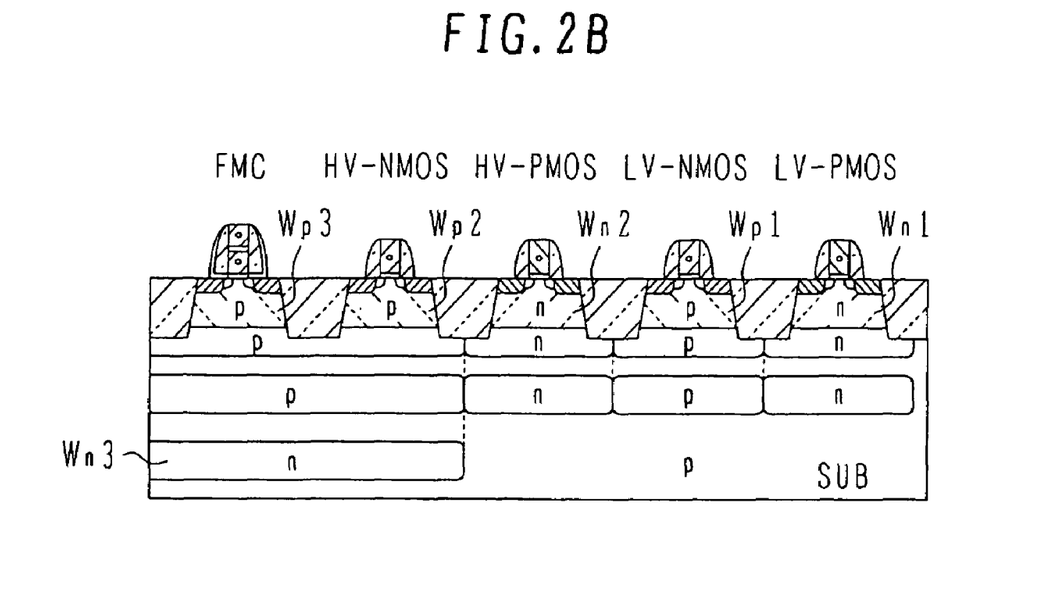

FIG. 2B is a schematic cross sectional view showing the structures of high voltage transistors to be used for controlling the flash memory cells of the semiconductor integrated circuit shown in FIG. 2A and low voltage transistors of the logical circuit. FIG. 2B shows from the left side a flash memory cell FMC, a high voltage n-channel MOS transistor HV-NMOS, a high voltage p-channel MOS transistor HV-PMOS, a low voltage n-channel MOS transistor LV-NMOS and a low voltage p-channel MOS transistor LV-PMOS.

LV-PMOS is formed in a first n-type well Wn1, and LV-NMOS is formed in a first p-type well Wp1. HV-PMOS is formed in a second n-type well Wn2, and HV-NMOS is formed in a second p-type well Wp2. The first and second n-type wells Wn1 and Wn2 have the same well impurity concentration, and the first and second p-type wells Wp1 and Wp2 have the same well impurity concentration. The flash memory cell FMC is formed in a third p-type well Wp3. The second p-type well Wp2 and third p-type well Wp3 are formed in a third n-type well Wn3.

The well of a high voltage transistor assuming a 5 V operation can be formed at the same well impurity concentration as that of low voltage transistors LV-NMOS and LV-PMOS. The well of a transistor assuming a 10 V operation is required to have a lower impurity concentration.

The well of a middle voltage transistor assuming a 3 V operation can be formed at the same well impurity concentration as that of a 5 V operation transistor. If transistors constituting the flash memory control circuits 117 and 118 for controlling flash memory cells 116 can be formed by the high voltage operation transistors shown in FIG. 2B, the number of processes can be reduced. In this case, the structure having an operation breakdown voltage of 10 V or higher is necessary.

Figure 2C:
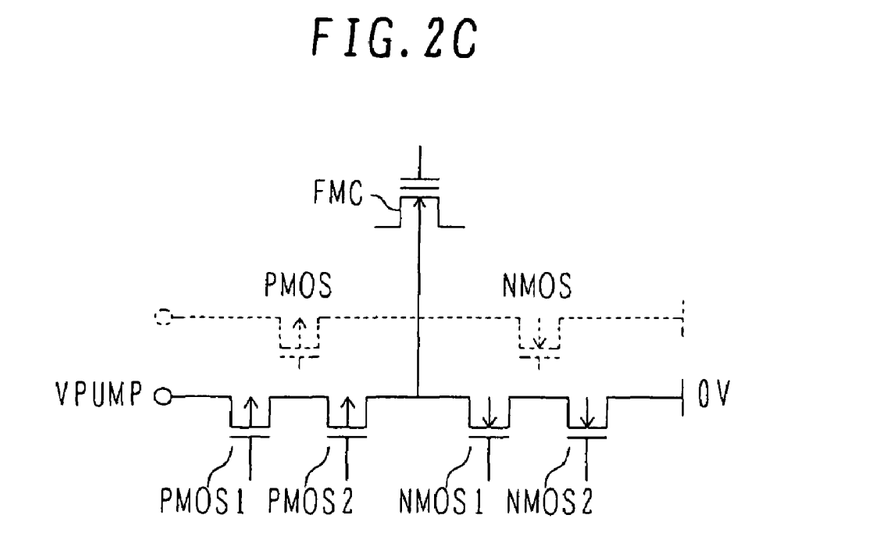

FIG. 2C is an equivalent circuit of the control circuit for controlling a flash memory cell.

In erasing data in a flash memory cell, a voltage of 10 V is applied to the well of the flash memory cell. A voltage of 10 V is applied from a pump circuit to a VPUMP terminal. A flash memory cell control circuit is shown by broken lines which is constituted of one p-channel MOS transistor PMOS and one n-channel MOS transistor NMOS. First, the p-channel MOS transistor PMOS is turned on and a voltage of 10 V is applied to the well of the flash memory cell. After the erase operation, the p-channel MOS transistor PMOS is turned off and the n-channel MOS transistor NMOS is turned on to drain charges in the well of the flash memory to the ground potential. The potential at the well becomes 0 V.

As the p-channel MOS transistor PMOS is turned on to start the erase operation, a voltage of −10 V is applied relative to the drain of PMOS. It is therefore necessary to set the operation breakdown voltage of PMOS to 10 V or higher. PMOS having the characteristics shown in FIG. 1B has an insufficient operation breakdown voltage.

As NMOS is turned on after the erase operation to drain charges in the well of the flash memory, a voltage of 10 V is applied to the drain of NMOS. It is therefore necessary to set the operation breakdown voltage of NMOS to 10 V or higher. The characteristics shown in FIG. 1B show an insufficient operation breakdown voltage.

In order to overcome this problem, instead of using a single p-channel MOS transistor PMOS, two cascade-connected p-channel MOS transistors PMOS1 and PMOS2 are used, and instead of using a single n-channel MOS transistor NMOS, two cascade-connected n-channel MOS transistors NMOS1 and NMOS2 are used. As two cascade-connected transistors are used, an occupation area in chip increases more than using one transistor. In order to suppress an increase in the occupation area in chip, two transistors are disposed in the same well.

The layout of STI and well contacts along a cross section of a central channel in the well was changed in various ways and breakdown voltages were obtained through two-dimensional simulation.

FIGS. 3A to 3E show the cross sectional structures of five types of samples S1 to S5.

Figure 3A:
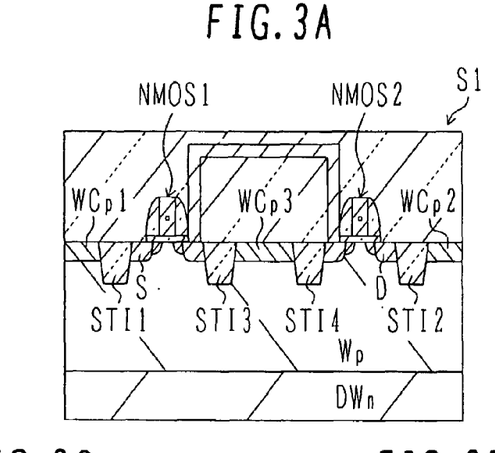
FIGS. 3A to 3E are cross sectional views showing the structures of samples.

FIG. 3A shows the cross sectional structure of a first sample S1. A p-type well Wp is formed in a deep n-type well DWn. On both sides of the well, well contact regions WCp1 and WCp2 having a width of 0.2 μm are formed outside shallow trench isolations STI1 and STI2 having a width of 0.3 μm. A well contact region WCp3 having a width of 0.8 μm is formed in the well central region between STI3 and STI4 having a width of 1.6 μm. An NMOS 1 is formed between STI1 and STI3, having n-type source/drain regions and a gate length of 1.5 μm, and an NMOS 2 is formed between STI4 and STI2, having n-type source/drain regions and a gate length of 1.5 μm.

Adjacent current terminals of both NMOS's are connected to form a cascade connection structure. The remaining current terminal of NMOS1 is used as a source S and the remaining current terminal of NMOS2 is used as a drain D. Electrodes are connected to the source S, drain D and each well contact region. In the following description, the elements represented by the same symbol have the same size, excepting the wells.

Figure 3B:
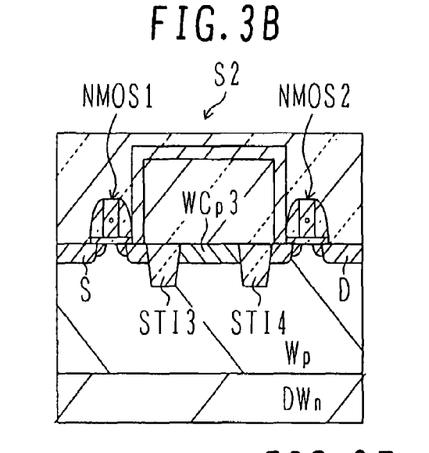

FIG. 3B shows the cross sectional structure of a second sample S2. This structure corresponds to the structure that both STI1 and STI2 and the well contact regions WCp1 and WCp2 of the sample S1 are removed. The length of the well can be reduced by 1 µm.

Figure 3C:
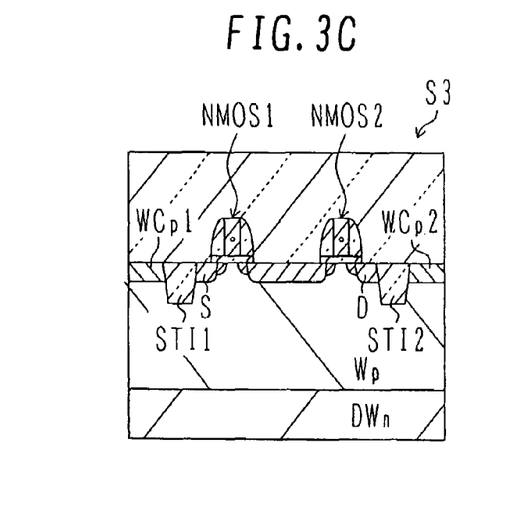

FIG. 3C shows the cross sectional structure of a third sample S3. This structure corresponds to the structure that the central well contact region WCp3 and STI3 and STI4 on opposite sides of the first sample are removed to combine the adjacent source/drain regions of NMOS1 and NMOS2. The length of the well can be reduced by 4 µm.

Figure 3D:
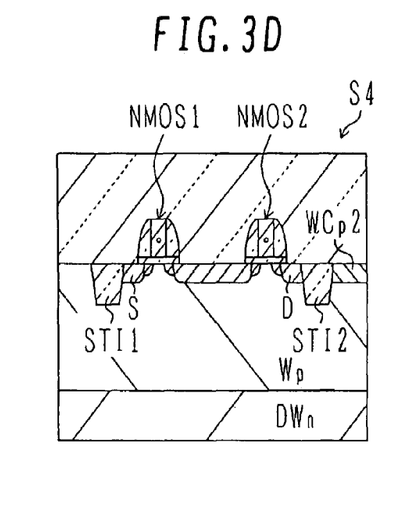

FIG. 3D shows the cross sectional structure of a fourth sample S4. This structure corresponds to the structure that the well contact region WCp1 of the third sample S3 on the left side (on the source side of the cascade connection) is omitted. The well contact region exists only on the drain D side of the cascade connection.

Figure 3E:
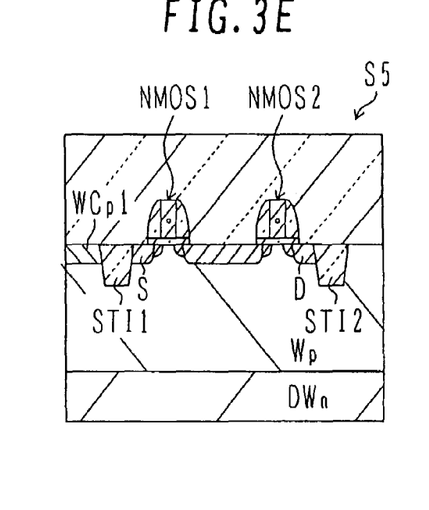

FIG. 3E shows the cross sectional structure of a fifth sample S5. This structure corresponds to the structure that the well contact region WCp2 of the third sample S3 on the right side (on the drain side of the cascade connection) is omitted. The well contact region exists only on the source S side of the cascade connection.

For the comparison, a sample S0 was formed which has one NMOS formed in one well. In this structure, only the left side portion from the center of the central well contact region WCp3 of the first sample S1 is disposed in the well.

FIGS. 4A to 4F are cross sectional views illustrating a process flow of the first sample S1. For the samples S2 to S5, the processes omitting the corresponding parts are executed.

Figure 4A:
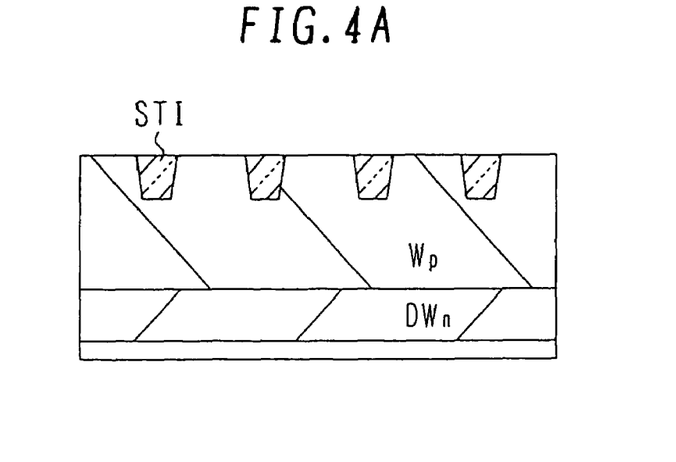
FIGS. 4A to 4F are cross sectional views illustrating the processes of forming a sample.

As shown in FIG. 4A, a shallow trench isolation STI is formed in an Si substrate. A deep n-type well DWn is formed by implanting n-type impurity ions $P^+$ at an acceleration energy of 2 MeV and a dose of 1 to 3 E13 $cm^{-2}$ (E is an exponent notation, E13 is equal to $\times 10^{13}$, this notation is applied also in the following). A p-type well Wp is formed by implanting p-type impurity ions $B^+$ at an acceleration energy of 400 to 500 keV and a dose of 1 to 2 E13 $cm^{-2}$, and again at an acceleration energy of 100 keV and a dose of 2 to 4 E12 $cm^{-2}$.

Figure 4B:
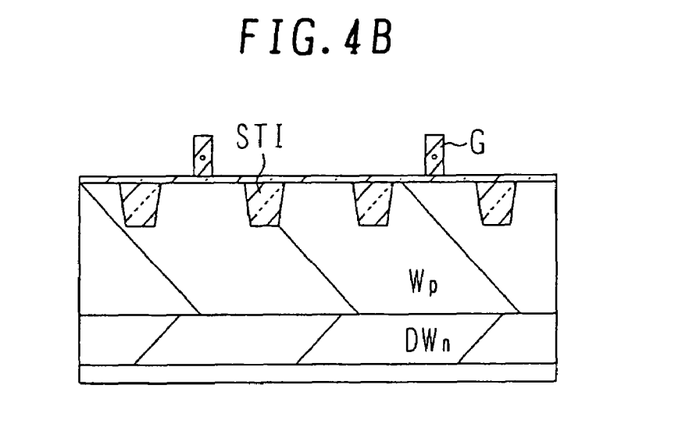

As shown in FIG. 4B, the silicon surface is thermally oxidized to form a gate oxide film having a thickness of 17 nm. A polysilicon layer is deposited by CVD to a thickness of 180 nm on the oxide film, and patterned at a gate length of 1.5 µm by photolithography and etching to form gate electrodes G.

Figure 4C:
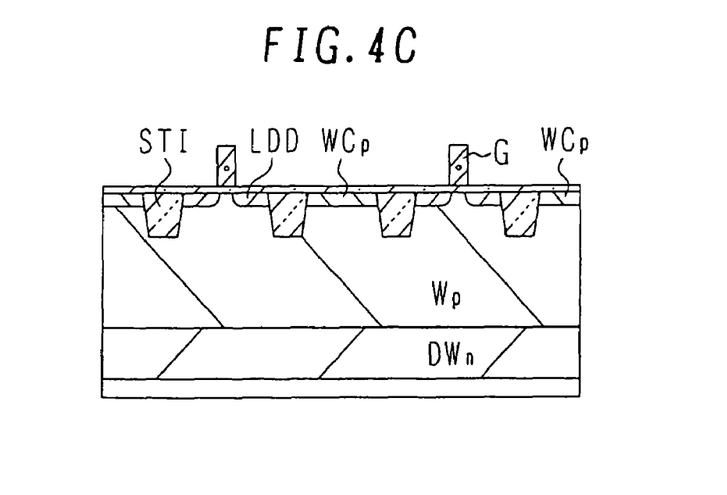

As shown in FIG. 4C, by using a photomask, n-type impurity ions $As^+$ are implanted into a transistor region at an acceleration energy of 100 to 150 keV and a dose of 1 to 3 E13 $cm^{-2}$ to form low impurity concentration source/drain regions LDD. In a well contact region, p-type impurity ions $BF_2^+$ are implanted at an acceleration energy of 50 to 100 keV and a dose of 1 to 2 E13 $cm^{-2}$ to form p-type well contact regions WCp. If a CMOS is to be formed, ion implantation for p-type well contact regions can be performed by the same ion implantation as PMOS LDD ion implantation.

Figure 4D:
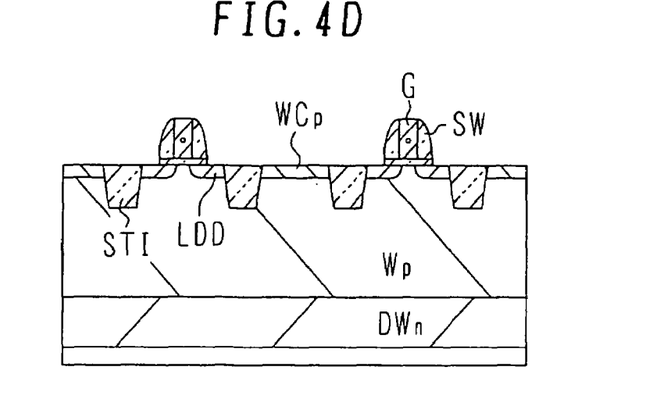

As shown in FIG. 4D, a silicon oxide layer having a thickness of about 130 nm is deposited by CVD on the Si substrate surface, and etched back by anisotropic etching to form side wall spacers SW having a thickness of about 130 nm on the gate electrode side walls.

Figure 4E:
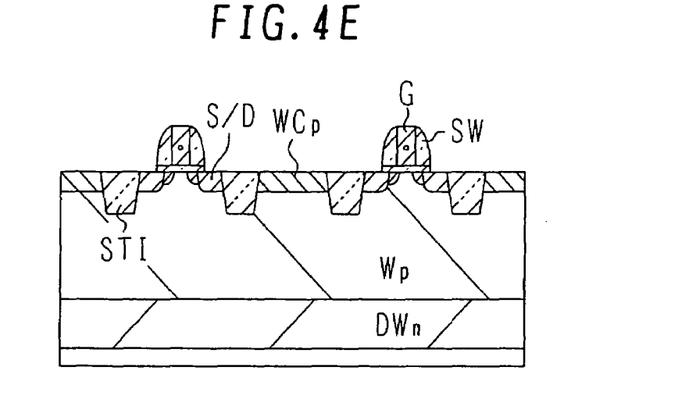

As shown in FIG. 4E, by using a photomask, high impurity concentration source/drain regions S/D are formed by implanting n-type impurity ions $P^+$ at an acceleration energy of 15 to 20 keV and a dose of 1 to 2 E15 $cm^{-2}$, and again at an acceleration energy of 10 to 15 keV and a dose of 5 to 8 E15 $cm^2$. In the well contact regions, p-type impurity ions $B^+$ are implanted at an acceleration energy of 5 to 8 keV and a dose of 2 to 5 E13 $cm^{-2}$ to form p-type contact regions WCp. If a CMOS is to be formed, ion implantation for the well contact regions can be performed by the same ion implantation as PMOS S/D ion implantation.

Figure 4F:
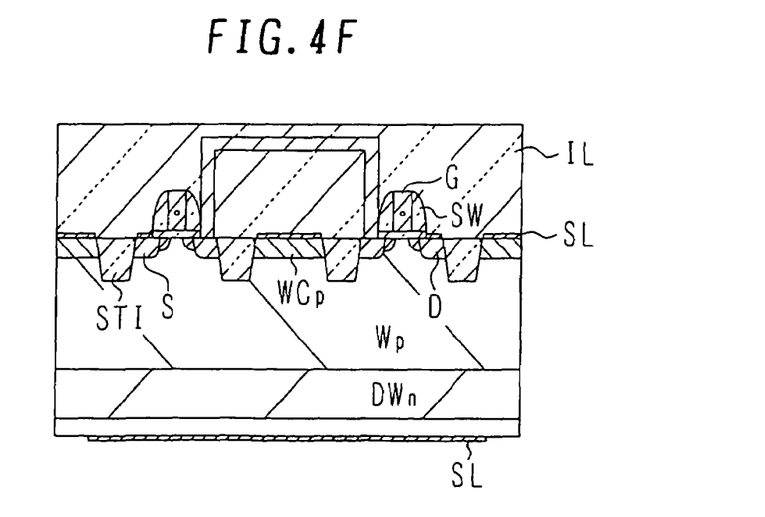

As shown in FIG. 4F, electrodes are formed on the well contact regions WCp and the source/drain regions on opposite sides, and an interlayer insulating film IL is formed on the substrate. A wiring for connecting inner side source/drain regions is formed. The Si substrate at the level lower than the impurity concentration peak of the deep n-type well DWn in terms of simulation is removed, and an electrode is formed on its surface.

As application voltages in terms of simulation, 1.2 V was applied to the deep n-type well DWn, 0V was applied to the p-type well from the well contact regions, 0 V was applied to the source S, and 5 V was applied to the gate G and a voltage applied to the drain D was swept.

Figure 5:
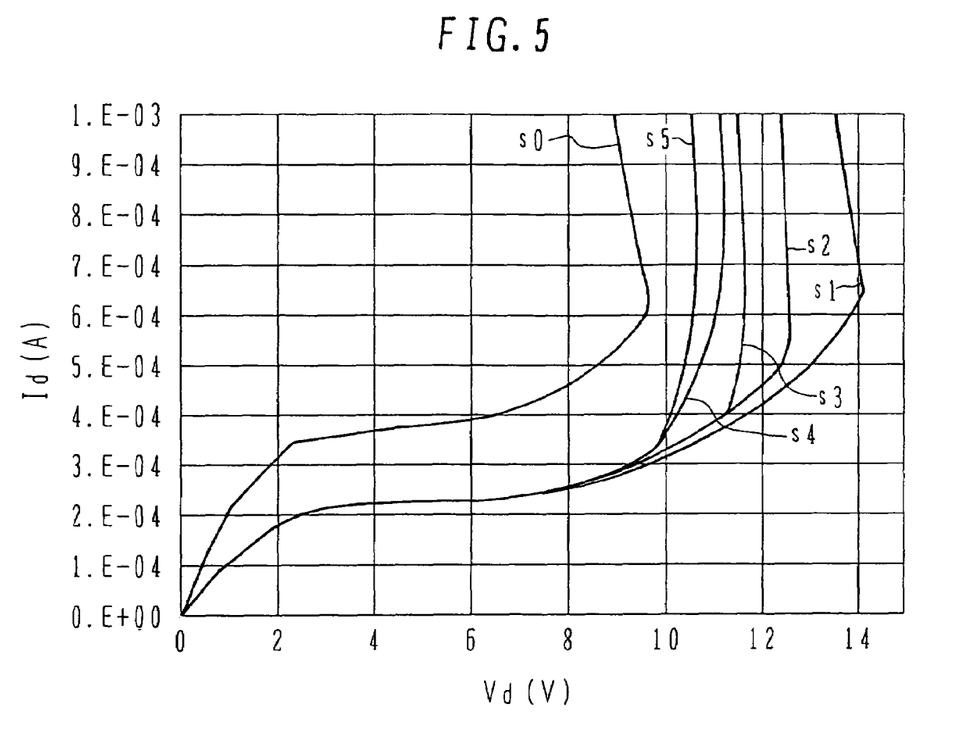
FIG. 5 is a graph showing the characteristics of samples obtained through simulation.

FIG. 5 is a graph showing the simulation results. The abscissa represents a sweep voltage Vd applied to the drain D in the unit of V, and the ordinate represents a drain current Id in the unit of A. Curves s0 to s5 indicate the characteristics of the samples S0 to S5, respectively. The characteristics s0 of the single transistor have the lowest breakdown voltage which does not exceed 10 V. The characteristics of the sample S5 having well contacts only outside the source S have the next lowest breakdown voltage which is about higher or lower than 10 V.

The characteristics s1 of the first sample S1 have a highest breakdown voltage which readily exceeds 13 V. Although the lower the breakdown voltage becomes, the more the structure is simplified as in the case of the sample S2, S3 and S4 and the more the occupation area in chip is reduced, the breakdown voltage is still higher than that of the sample S5. It is therefore preferable to use the structures of the samples S1 to S4 if two or more transistors MOS transistors are formed in one well. The samples S1 to S3 among others flow a stable drain current at 11 V or lower.

Figure 6A:
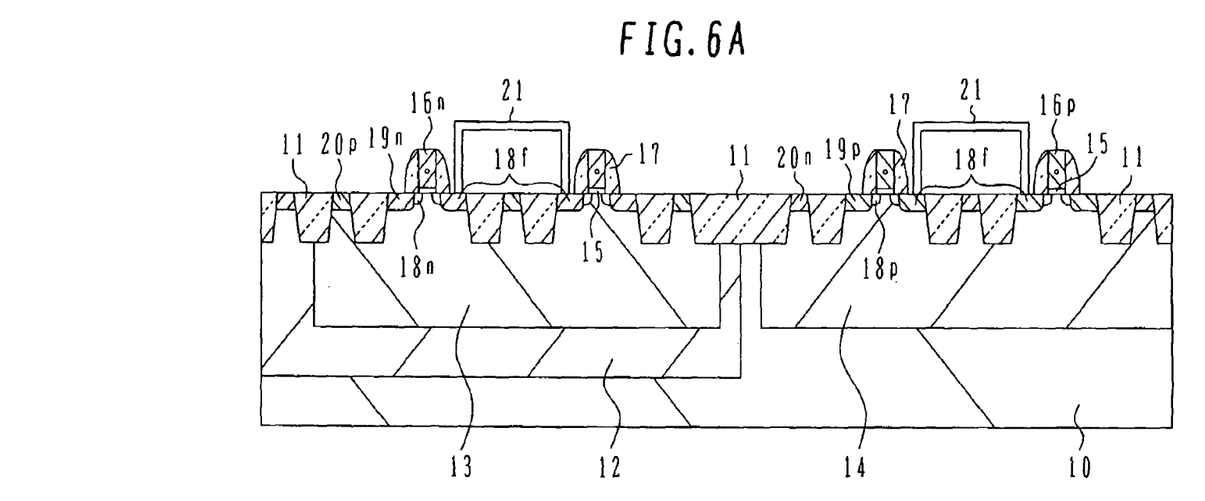
FIGS. 6A to 6C are a cross sectional view and plan views showing a first embodiment.
Figure 6B:
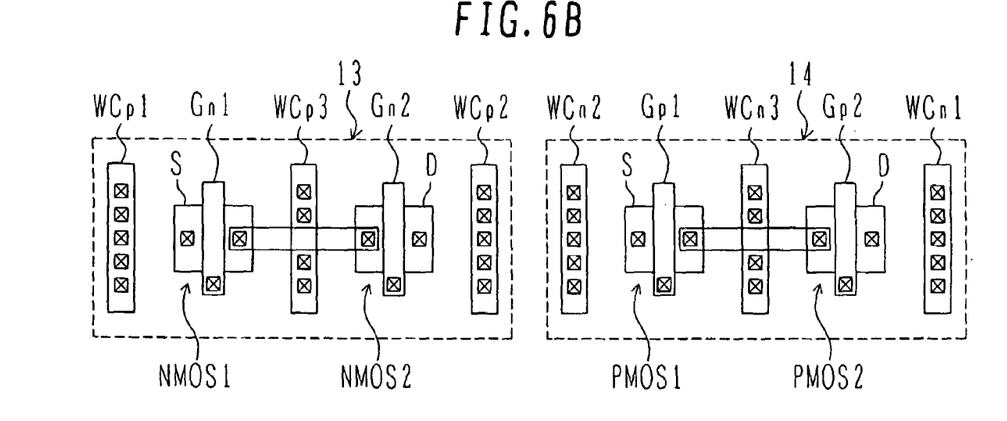

FIGS. 6A and 6B show a semiconductor device using the structure of the first sample S1 according to the first embodiment. FIG. 6A is a cross sectional view and FIG. 6B is a plan view. Formed in an NMOS region of a p-type silicon substrate by executing the processes shown in FIGS. 4A to 4F are: an element isolation region 11; a deep n-type well 12; a p-type well 13, gate insulating films 15; n-type gate electrodes 16n; side wall spacers 17; n-type LDD regions 18n; n-type source/drain regions 19n; p-type well contact regions 20p; and wirings 21. Formed in a PMOS region by using the same processes are: an element isolation region 11: gate insulating films 15; side wall spacers 17; and wirings 21. In the PMOS region, by using the opposite conductivity type in the ion implantation processes, there are formed: an n-type well 14; p-type gate electrodes 16p; p-type LDD regions 18p; p-type source/drain regions 19p and n-type well contact regions 20n. As described previously, ion implantation can be used in common to both the source-drain regions and well contact regions.

As shown in FIG. 6B, in the p-type well 13, two n-channel MOS transistors NMOS1 and NMOS2 having the same structure as that of the sample S1 are formed and cascade-connected, and in the n-type well 14, two p-channel MOS transistors PMOS1 and PMOS2 having the same structure as that of the sample S1 are formed and cascade-connected. The source/drain regions on opposite sides of each cascade connection are called a source S and a drain D. The well contact regions are formed between two transistors (WCp3 and WCn3) and outside the source and drain (WCp1, WCp2, WCn1 and WCn2).

Breakdown occurs when the potential of the well rises because of an impact ionization multiplication mechanism and a lateral type parasitic bipolar transistor of source-well-drain becomes conductive. By disposing well contacts outside each MOS transistor and between MOS transistors, it is possible to prevent the potential of the well near the source from being raised and to raise the breakdown voltage because the lateral type bipolar transistor will be become conductive.

Figure 6C:
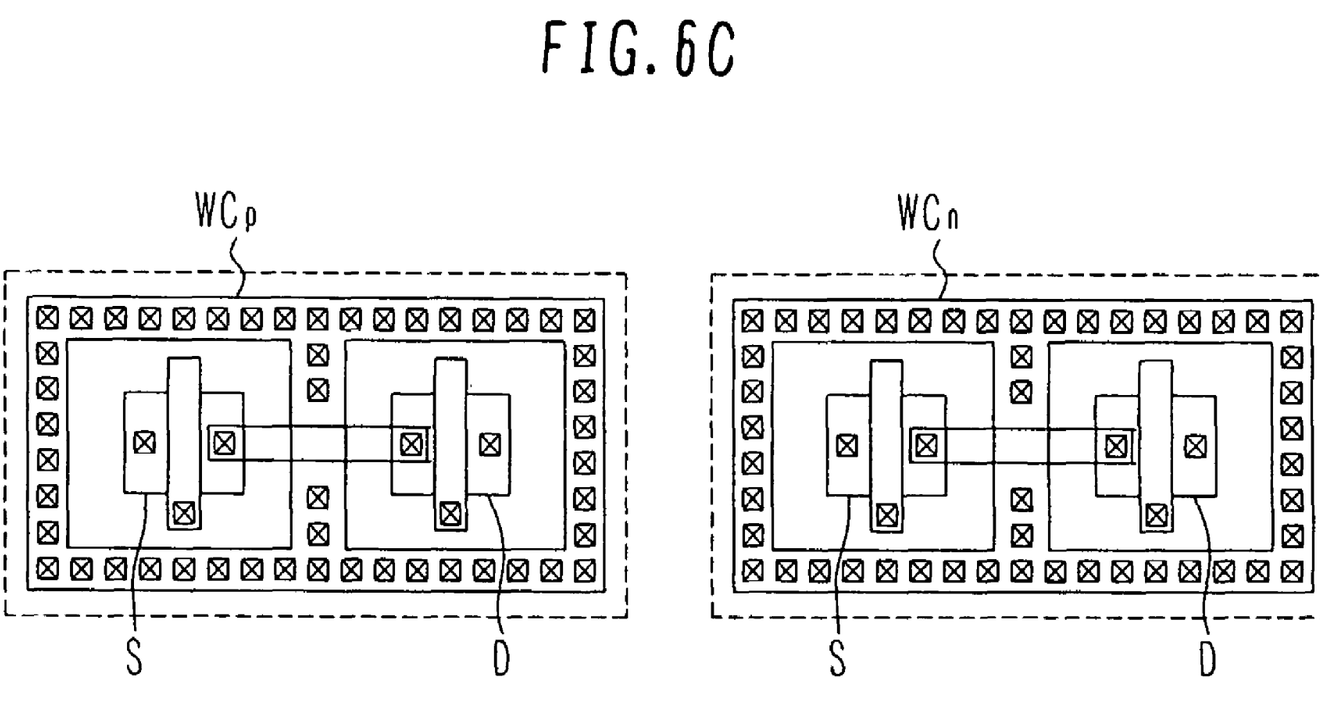

FIG. 6C shows a modification. The cross sectional structure along a current direction is similar to that shown in FIG. 6A. In this structure, three well contact regions WCp1, WCp2 and WCp3 and three well contact regions WCn1, WCn2 and WCn3 are coupled by well contact regions disposed in the upper and lower areas, to form continuous well contact regions. By disposing the well contact regions also at the sides of, or side by side with, the transistors, the potential of the well can be stabilized and the breakdown voltage can further be improved. Although it is not necessarily required to surround the transistor with the well contact regions, the reliability is expected to be improved by surrounding the transistor with the well contact regions.

Figure 7:
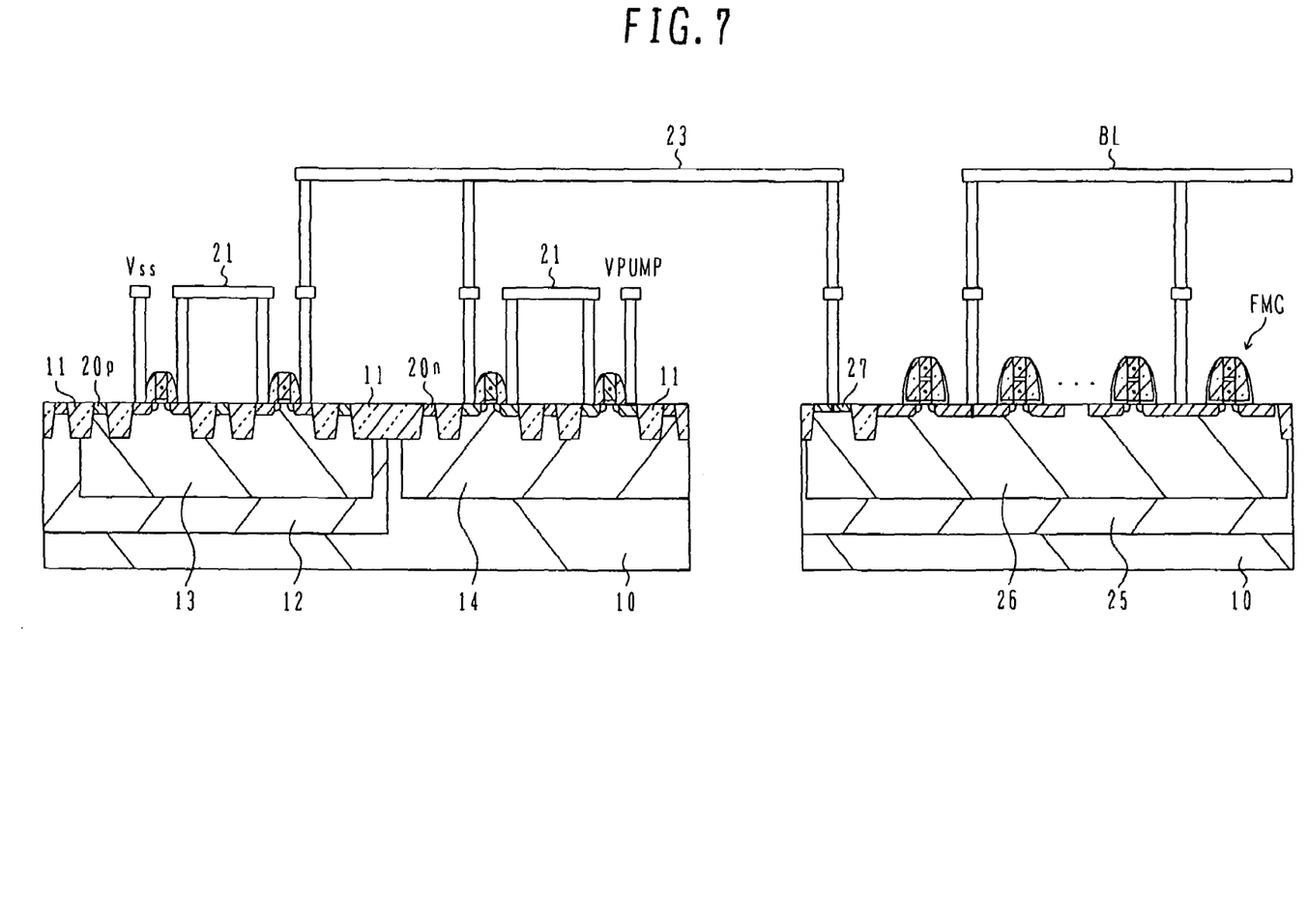
FIG. 7 is a cross sectional view showing the structure of a flash memory circuit according to the first embodiment.

FIG. 7 shows the structure of the flash memory circuit shown in FIG. 2C by using the structure shown in FIG. 6A. The cascade circuit shown in FIG. 6A is formed in the left area of FIG. 7, and flash memory cells FMC are formed in the right area. In the flash memory area, a deep n-type well 25 is formed, and in this n-type well, a p-type well 26 is formed. In the p-type well 26, a number of n-channel FMC's and p-type well contact regions 27 are formed. Outputs of cascade connections are applied via wirings 23. An output of each flash memory cell FMC is supplied via a bit line BL.

Figure 8A:
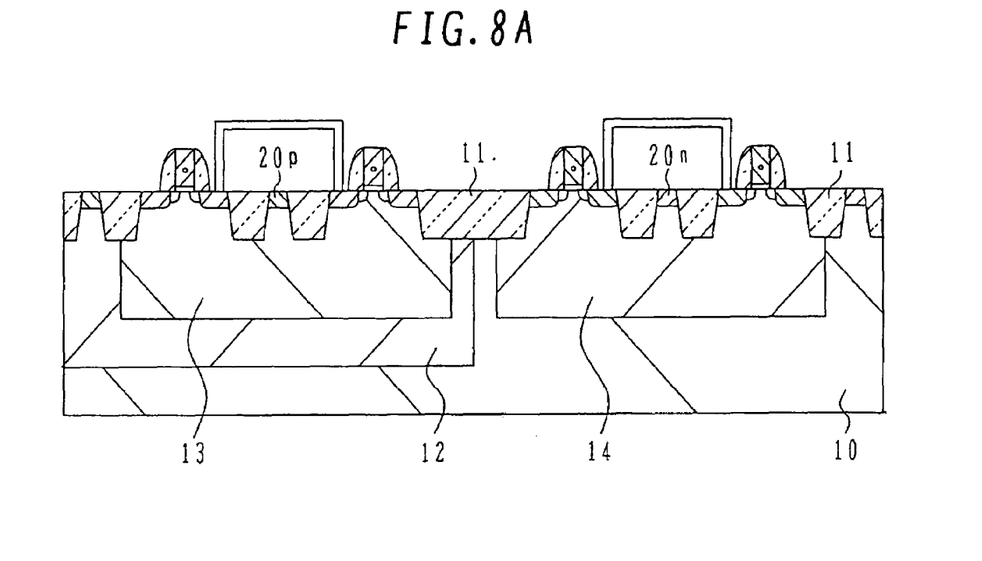
FIGS. 8A and 8B are a cross sectional view and a plan view showing a second embodiment.
Figure 8B:
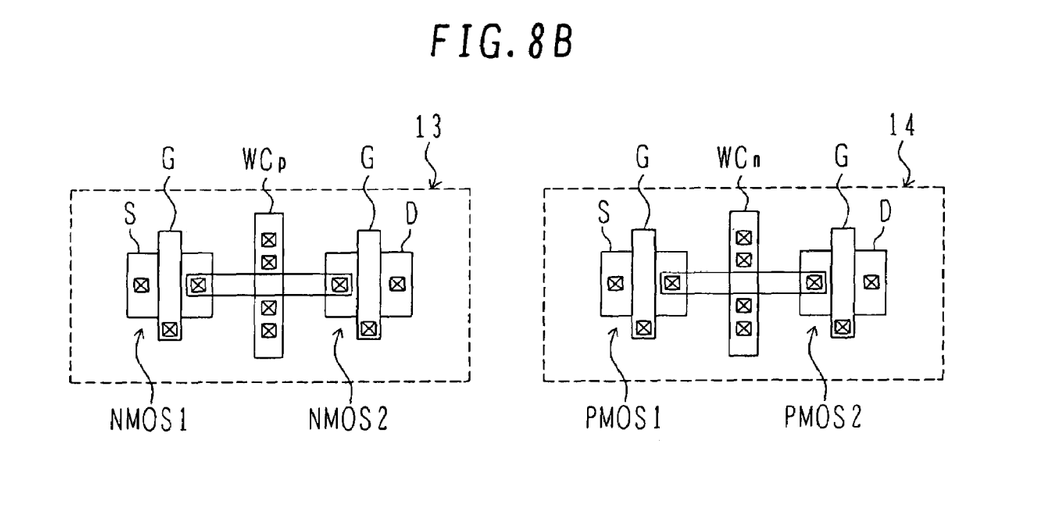

FIGS. 8A and 8B show a semiconductor device using the structure of the second sample S2 according to the second embodiment.

As shown in FIG. 8A, well contact regions 20p and 20n are formed only between two cascade-connected transistors. By omitting STI and well contact regions outside the source S and drain D, the lateral size as viewed in FIG. 8A can be made small.

FIG. 8B shows a plan layout. In a p-type well 13, two n-channel MOS transistors NMOS1 and NMOS2 are formed, and p-type well contact regions WCp are formed between the MOS transistors. The inner source/drain regions are connected by a wiring, and the outer source/drain regions form a source S and a drain D. In an n-type well 14, two p-channel MOS transistors PMOS1 and PMOS2 are formed, and n-type well contact regions WCn are formed between the MOS transistors. The inner source/drain regions are connected by a wiring, and the outer source/drain regions form a source S and a drain D.

In the circuit shown in FIG. 7, as the left side cascade connection circuit is replaced with the cascade connection circuit of this embodiment, a flash memory circuit can be formed.

Figure 9A:
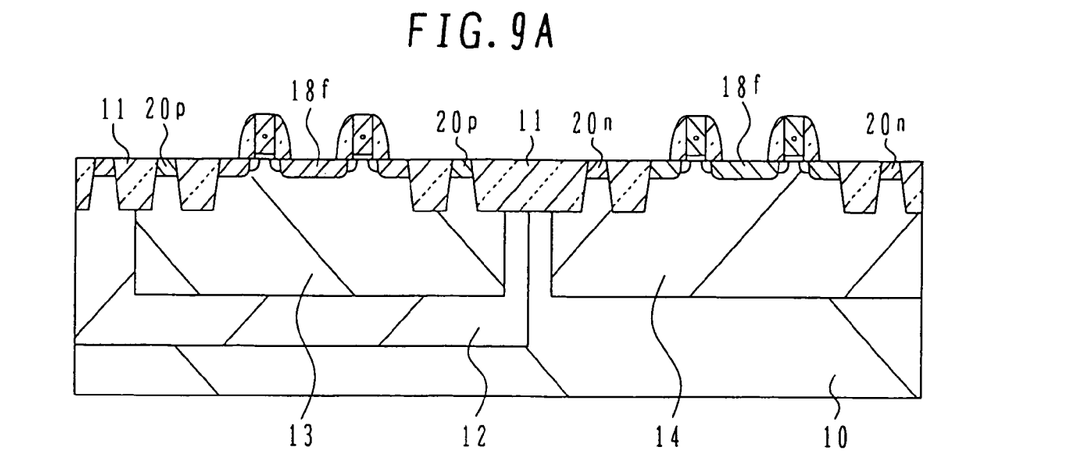
FIGS. 9A, 9B and 9C are a cross sectional view and plan views showing a third embodiment.
Figure 9B:
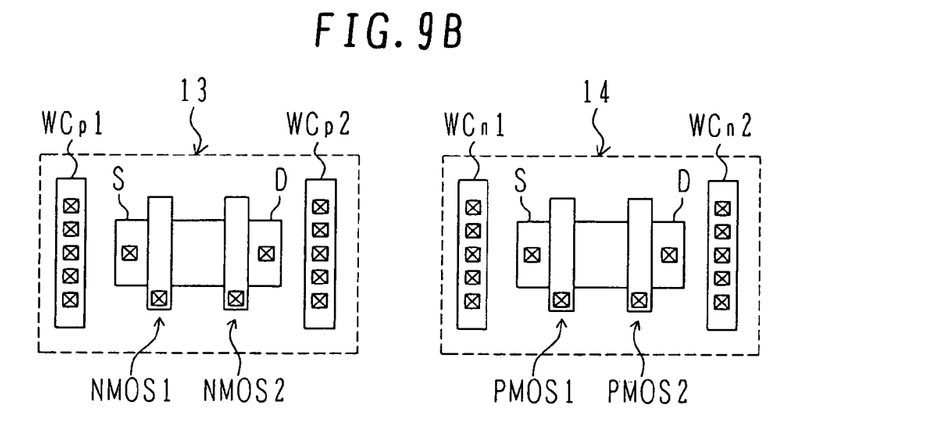

FIGS. 9A and 9B show the structure of a semiconductor device using the structure of the third sample S3 according to the third embodiment.

As shown in FIG. 9A, the source/drain regions of two adjacent transistors are integrated to form a common region 18f, and well contact regions 20p and 20n are formed only outside a source S and a drain D. By omitting STI and well contact regions between the two transistors, the lateral size as viewed in FIG. 9A can be made small.

FIG. 9B shows a plan layout. In a p-type well 13, two n-channel MOS transistors NMOS1 and NMOS2 are formed merging the adjacent source/drain regions, and p-type well contact regions WCp1 and WCp2 are formed on the both outer sides of the MOS transistors. The outer source/drain regions form a source S and a drain D. In an n-type well 14, two p-channel MOS transistors PMOS1 and PMOS2 are formed merging the adjacent source/drain regions, and n-type well contact regions WCn1 and WCn2 are formed on the both outer sides of the MOS transistors. The outer source/drain regions form a source S and a drain D.

In the circuit shown in FIG. 7, as the left side cascade connection circuit is replaced with the cascade connection circuit of this embodiment, a flash memory circuit can be formed.

Figure 9C:
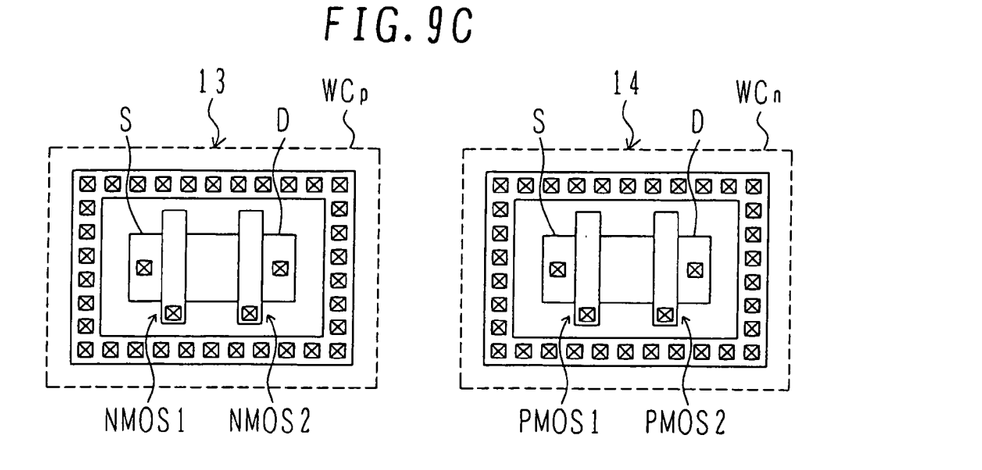

FIG. 9C shows a modification. The cross sectional structure along a current direction is similar to that shown in FIG. 9A. In this structure, two well contact regions WCp1 and WCp2 of two transistors and two well contact regions WCn1 and WCn2 of two transistors are coupled by well contact regions disposed in the upper and lower areas, to form continuous well contact regions WCp and WCn. By disposing the well contact regions also at the sides of the transistors, the potential of the well can be stabilized and the breakdown voltage can further be improved. Although it is not necessarily required to surround the transistor with the well contact regions, the reliability is expected to be improved by surrounding the transistor with the well contact regions.

Figure 10A:
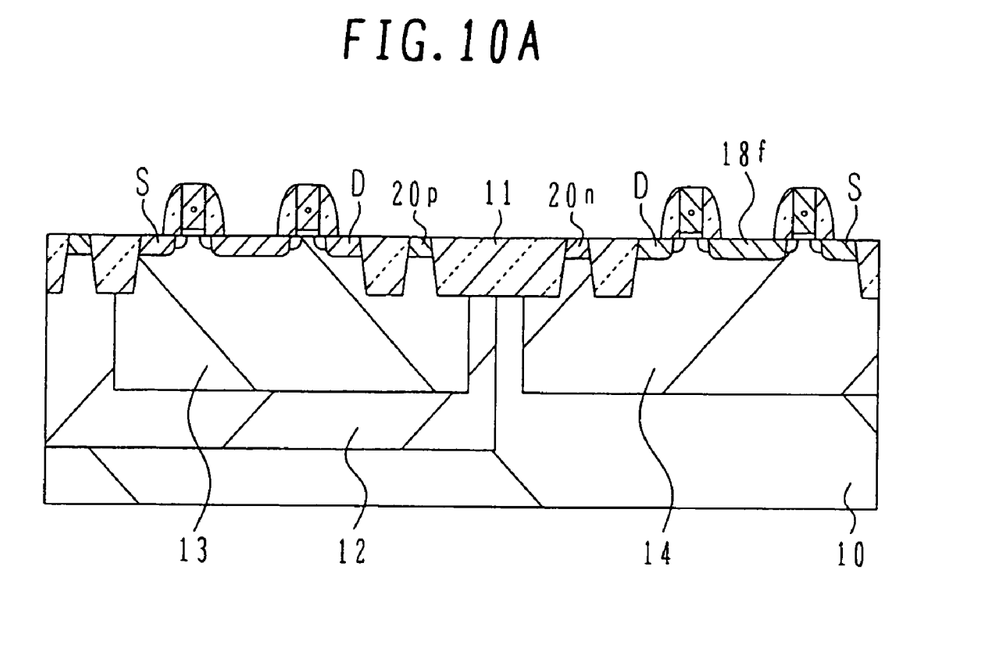
FIGS. 10A and 10B are a cross sectional view and a plan view showing a fourth embodiment.
Figure 10B:
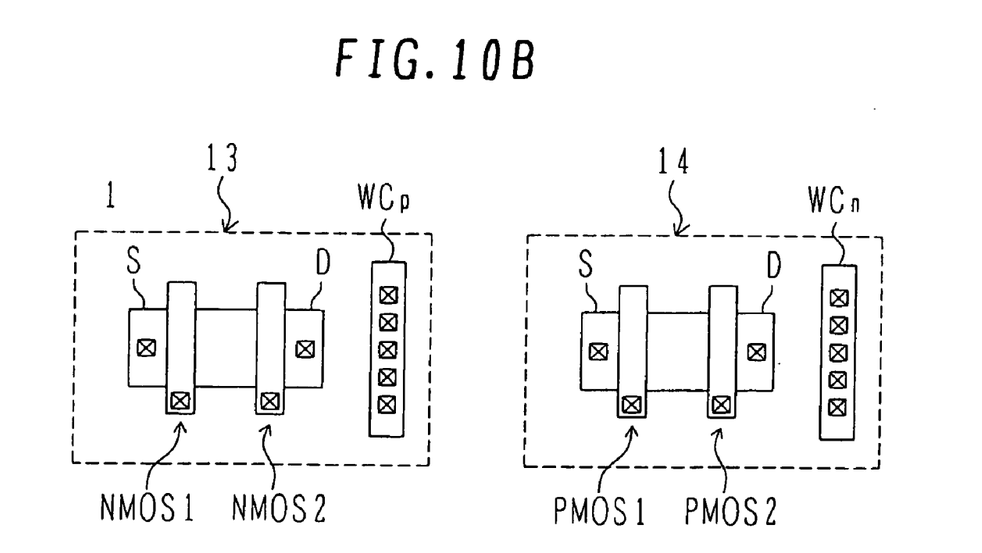

FIGS. 10A and 10B show the structure of a semiconductor device using the structure of the fourth sample S4 according to the fourth embodiment.

As shown in FIG. 10A, transistors have the same structure as that shown in FIG. 9A. Well contact regions 20p and 20n are formed only outside the drain of two cascade-connected transistors. As compared to FIG. 9A, since STI and well contact regions outside the source S are omitted, the lateral size as viewed in FIG. 10A can be made small.

FIG. 10B shows a plan layout. In a p-type well 13, two n-channel MOS transistors NMOS1 and NMOS2 are formed merging the inner source/drain regions, and the outer source/drain regions form a source S and a drain D. Outside the drain D, p-type well contact regions WCp are formed. In an n-type well 14, two p-channel MOS transistors PMOS1 and PMOS2 are formed merging the inner source/drain regions, and the outer source/drain regions form a source S and a drain D. Outside the drain D, n-type well contact regions WCn are formed.

In the circuit shown in FIG. 7, as the left side cascade connection circuit is replaced with the cascade connection circuit of this embodiment, a flash memory circuit can be formed.

The present invention has been described in connection with the preferred embodiments. The invention is not limited only to the above embodiments. For example, the cascade connection in an n-type well may have a different structure from that of the cascade connection in a p-type well, for example, the structure of the first sample in the n-type well and the structure of the second sample in the p-type well. A cascade connection made of discrete transistors may be used for one of the n- and p-type transistors. The well contact regions at the sides of a cascade connection similar to that of the modifications of the first and third embodiments may be adopted in the second and fourth embodiments. It will be apparent to those skilled in the art that other various modifications, improvements, combinations, and the like can be made.

What is claimed is:

1. A semiconductor device comprising:
a main circuit including a plurality of MOS transistors operating at a first voltage;
a memory requiring an operation at a second voltage higher than said first voltage; and
a drive circuit for driving said memory, said drive circuit comprising one well, two or more MOS transistors in a cascade connection formed in said well, and first kind of well contact formed in said well between said MOS transistors and on both outer sides of the cascade connection along interconnecting direction of the cascade connection, or formed only between said MOS transistors, or formed on both outer sides of the cascade connection along said interconnecting direction, or formed only outside a drain of said MOS transistors in the cascade connection along said interconnecting direction.

2. The semiconductor device according to claim 1, wherein said drive circuit further comprises second kind of well contact formed in said well side by side with each of said MOS transistors with respect to a direction crossing said interconnecting direction.

3. The semiconductor device according to claim 2, wherein said first kind of well contact is formed between MOS transistors and on both outer sides of the cascade connection along said interconnecting direction, and said first and second kind of well contacts are disposed surrounding each of the MOS transistors.

4. The semiconductor device according to claim 2, wherein said first kind of well contact is formed only on both outer sides of the cascade connection along said interconnecting direction in said well.

5. The semiconductor device according to claim 4, wherein said first and second kind of well contacts are disposed surrounding outside the MOS transistors of the cascade connection.

6. The semiconductor device according to claim 1, wherein said drive circuit further includes another well having a conductivity type opposite to a conductivity type of said one well, other two or more MOS transistors and third kind of well contact formed in said other well and having same layout as layout of said two or more MOS transistors and said first kind of well contact and respectively opposite conductivity types.

7. The semiconductor device according to claim 1, wherein said memory is a flash memory.

8. The semiconductor device according to claim 1, wherein said second voltage is 10 V for programming and erase.

9. The semiconductor device according to claim 1, wherein said main circuit is a CMOS logic circuit.

10. The semiconductor device according to claim 9, wherein said main circuit includes a well having a same well impurity concentration as a well impurity concentration of said one well.

* * * * *